United States Patent [19]

Ebneth et al.

[11] Patent Number: 4,471,015
[45] Date of Patent: Sep. 11, 1984

[54] COMPOSITE MATERIAL FOR SHIELDING AGAINST ELECTROMAGNETIC RADIATION

[75] Inventors: Harold Ebneth, Leverkusen; Hans G. Fitzky, Odenthal; Wolfgang Oberkirch, Cologne, all of Fed. Rep. of Germany

[73] Assignee: Bayer Aktiengesellschaft, Leverkusen, Fed. Rep. of Germany

[21] Appl. No.: 513,893

[22] Filed: Jul. 14, 1983

[51] Int. Cl.³ .............................................. B32B 3/00
[52] U.S. Cl. .................................. 428/195; 174/35 R; 252/511; 428/206; 428/208; 428/283; 428/323; 428/333; 428/378; 428/389; 428/397; 428/403; 428/922; 428/936; 428/457
[58] Field of Search .................... 523/137, 215, 222; 174/35 MS, 35 GC, 35 R; 428/195, 206, 209, 283, 323, 328, 375, 379, 381, 389, 403, 922, 936

[56] References Cited

U.S. PATENT DOCUMENTS 2,718,506 9/1955 Elleman .............................. 523/137
2,923,934 2/1960 Halpern .............................. 523/137

Primary Examiner—James J. Bell
Attorney, Agent, or Firm—Sprung Horn Kramer & Woods

[57] ABSTRACT

A composite material comprising a polymer matrix containing metallized sheet-form textiles and/or metallized particles, and in addition additives for increasing the ohmic, electrical and/or magnetic losses which are uniformly present in the polymer and/or on the sheet-form textiles and/or particles, has a high shielding effect against electromagnetic radiation both in the short-range field and also in the long-range field over a wide frequency range.

10 Claims, 4 Drawing Figures

COMPOSITE MATERIAL FOR SHIELDING AGAINST ELECTROMAGNETIC RADIATION

This is a division of application Ser. No. 272,803, filed June 11, 1981 now U.S. Pat. No. 4,435,465.

BACKGROUND OF THE INVENTION

The present invention relates to a composite material for electromagnetic shielding.

The function of electromagnetic shielding is to eliminate or a least reduce the amount of energy radiated into a certain space or the electromagnetic radiation emitted from a space. Shields of the type in question are variously required for avoiding extraneous diffusion into cables and electronic circuits, for suppressing illegal broadcasts from monochromatic or even wide-band jamming stations or even for personnel protection, more particularly as radiation protection in the microwave range. The shielding effect is based on two factors: firstly, some of the incident radiation is reflected at the surface of the shield and, secondly, that part of the radiation which penetrates into the medium is continuously absorbed as it passes through the shield. A shielding material is required on the one hand to combine high conductivity with minimal thickness (metal shield) so that the degree of reflection is high. Problems can arise at seams. In the event of unsatisfactory, seamless contacting over a large surface, stray fields are capable of entering the shielded space. On the other hand, the shield may be constructed as a "black body" which absorbs all the radiation and converts it into heat. It is possible in this way to avoid surface currents and to eliminate contacting problems. However, there is no such thin as a universally usable shielding material because the wave impedance of the long-range field does not have the same values as in the short-range field, although on the other hand it is essential in a black body for the wave impedance of the space to be adapted to the surface resistance of the body.

SUMMARY OF THE INVENTION

An object of the present invention is to provide a material characterized by a high shielding effect against electromagnetic radiation. The material in intended to be as inexpensive as possible, of minimal wall thickness, flexible, optionally injection-moldable and suitable for shielding in particular against electromagnetic radiation in the frequency range of from $10^4$ to $10^{11}$ Hz both in the short-range field and in the long-range field. In the case of stray magnetic diffusion, the frequency range around 50 Hz can also be important.

According to the invention, this object is achieved by a composite material which is characterized in that metallized sheet-form textiles and/or metallized particles are contained in a polymer matrix and, in addition, additives for increasing the ohmic, electrical and/or magnetic losses are uniformly present in the polymer and/or on the sheet-form textiles and/or particles. Further advantageous embodiments are described hereinafter.

The material according to the invention has an unexpectedly high shielding effect. It is known from German Offenlegungsschrift No. 2,847,486 that metallized sheet-form textiles can be used for protection against microwave radiation. It is also known that the specific electrical conductivity of a sheet-form textile is very much higher if the metal layer has been applied by currentless wet-chemical deposition than if the same quantity of metal had been applied by vapor deposition or sputtering because the individual fibers are uniformly covered with metal (even in the shaded-off parts). However, it is surprising that the shielding effect can be considerably increased by the matrix of polymers, i.e. by the embedding of the sheet-form textile. In contrast to the absorption and reflection effect known per se of a sheet-form textile or metal shield, it has also been found that there is no need for the strictly seamless, uniform surface metallization of sheet-form textiles or even for a correspondingly dense accumulation of particles. The shielding effect is even intensified when the metallization is not uniform and when the additives for increasing the ohmic, electrical and/or magnetic losses are not uniformly present in the matrix, but preferably on the sheet-form textiles and/or particles.

The expressions "sheet-form textiles" and "particles" are intended to be broadly interpreted. In the context of the invention, sheet-form textiles are understood to be woven fabrics, knitted fabrics, non-woven fabrics, felts, papers or chopped-strand mats, while particles are understood, for example, to be flat, spherical or rodlet-like. Particles (for example individual fibers) which may even have a profile, for example trilobal. The particles may be pigments or conductive carbon black. It is favorable for the particles themselves to consist of electrical and/or magnetic dissipative dielectrics. The matrix, that is the resin, should be selected in such a way that it is also dissipative; this property may be incorporated in a non-conductive resin by additions of, for example, conductive carbon black or organic metals, for example tetrathiofulvalene-tetracyanoquinodimethane or sodium-doped polyacetylene. The conductivities should preferably be in the range of from $10^{-2}$ to $10^4$ (ohm$^{-1}$ cm$^{-1}$). In addition, the material may be lined with surface layers which may also be absorbent in character.

BRIEF DESCRIPTION OF THE DRAWINGS

The invention is described in more detail in the following with reference to the accompanying drawings, wherein.

DETAILED DESCRIPTION OF THE INVENTION

Figure 1:
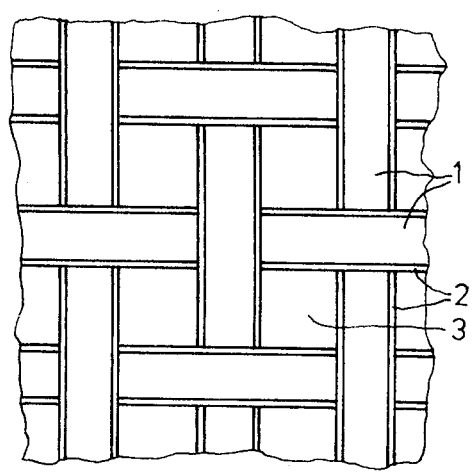
FIG. 1 is a plan view of a composite material containing a metallized woven fabric.
Figure 2:
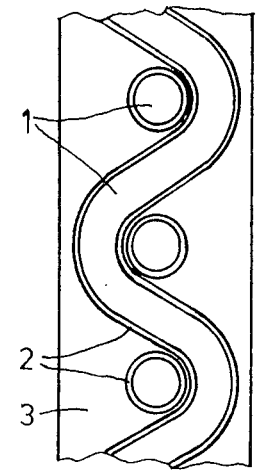
FIG. 2 is a section through a composite material containing a metallized woven fabric.

The fibers 1 in FIGS. 1 and 2 are provided with 0.6$\mu$ thick nickel coating 2. In this example, the fibers in question are spun polyacrylonitrile fibers in a so-called Wevenit fabric. The sheet-form textile is embedded in flexible PVC 3 to which 10% of conductive carbon black has been added. The composite material has an overall thickness of 0.75 mm. The shielding effect of this material in the range of from $5 \times 10^7$ to $10^{11}$ Hz is shown in Table 1. The minimum attenuation amounts to 45 dB. The material is not completely isotropic. Linearly polarized radiation is used for measuring the attenuation factor. Table 1 shows the absorption values with the E-vector parallel and perpendicular to the rodlet direction, which are broadly in line with the minimum and maximum values.

In this example, the attenuation effect of the components was also measured. The lined, non-metallized knitted fabric gives an attenuation of 21 dB in the range of from 11 to 12 GHz. A very high increase is obtained for the combination of lining and metallization.

TABLE 1

| Frequency in GHz | 0.05 | 1-1.5 | 2-2.4 | 8-9 | 11-12 | 35-26 |
|---|---|---|---|---|---|---|
| Attenuation in dB (1) | 51 | 46 | 46 | 46 | 48 | 45 |
| Attenuation in dB (2) | 55 | 55 | 55 | 65 | 65 | 60 |

In another example, a woven fabric of fibers spun from equal quantities of polyester and cotton is coated by currentless wet-chemical deposition with a 0.5 μm thick layer of nickel. The metallized fabric was laminated with a flexible PVC which contained approximately 15% of conductive carbon black. The composite material was 0.25 mm thick. The attenuation effect is shown in Table 2. The non-metallized, laminated fabric gave an attenuation of only 0.9 dB while the metallized, but non-laminated, fabric gave an attenuation of 16 dB. On the one hand, the attenuation effect of this fabric is weaker because the material is thinner by a factor of 3, but on the other hand the surface current passes through fewer capacitive contact points per unit area in a woven fabric than in a knitted fabric. With linear polarization, attenuation is measured parallel to the warp and weft direction.

Figure 3:
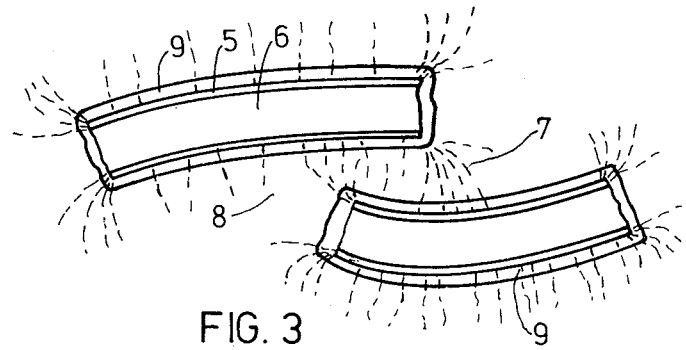
FIG. 3 shows a composite material containing a chopped-strand mat.

In the composite material according to the invention, the high-frequency field is concentrated to a far greater extent in the dissipative matrix by the current induced in the metallized structure. In addition, the flow of current in the metallized structure is divided and interrupted in many ways. Two partly metallized elongate particles are shown in FIG. 3. The structure in question is a chopped-strand mat which was cut after metallization. The metal layers 5 on the fibers 6 do not touch one another. The field strength is particularly high at the edges, as indicated in FIG. 3 by a particularly high field line density 7. The dielectric losses per unit volume are known to be proportional to the square of the electrical field strength. In this example, the thickness of the monofils ranged from 0.5 to 5 μm, that of the metallization from 0.05 to 0.5 μm and the length of the fibers from 0.5 to 5 mm. The monofil may be a glass fiber or even a synthetic or natural organic fiber. It has been found that attenuation factors as high as those indicated in Table 2 are also obtained when metallization is carried out after chopping. The fibers in FIG. 3 are embedded in a conductive PVC containing from 12 to 15% of conductive carbon black. Typical filling factors may amount to as much as 30%.

TABLE 2

| Frequency in GHz | 0.05 | 1-1.5 | 2-2.4 | 8-9 | 11-12 | 35-36 |
|---|---|---|---|---|---|---|
| Attenuation in dB (1) | 33 | 26 | 22 | 24 | 25 | 27 |
| Attenuation in dB (2) | 44 | 41 | 37 | 33 | 37 | 31 |

In general, a particular orientation of the monofils is not required for obtaining an isotropic effect irrespective of the polarization of the electrical or magnetic fields. In this example, the metallized particles are overcoated with a dissipative layer 9 before being embedded in the resin matrix. This is particularly advantageous because, in general, the addition of additives to the resin matrix is limited by the necessary strength of the material, whereas the dissipative additives, such as conductive carbon black, graphite or ferrite, may be directly applied to the metallized particles or sheet-form textiles without having to take mechanical strength requirements into account.

Figure 4:
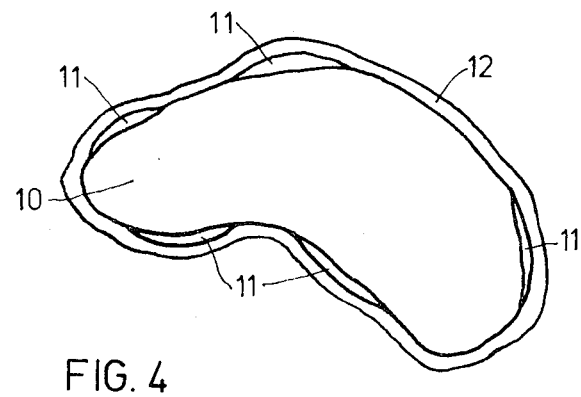
FIG. 4 shows a composite material containing metallized particles.

A partly metallized pigment particle is shown in FIG. 4. The substrate 10, for example of ferrite, conductive carbon black or an "organic metal", for example tetrathiofulvalene-tetracyanoquinodimethane, is partly metallized. By inoculation with palladium nuclei or ions, the substrate 10 is provided with a thin, continuous metallization (for example of cobalt nickel, nickel-iron alloy, cobalt-nickel alloy or copper), the bath treatment described in German Offenlegungsschrifts Nos. 2,739,179; 2,734,768; 2,749,151; 2,804,031; 2,820,502; and 2,820,525 being correspondingly shortened. This particle is overcoated with a layer 12 of a suitable additive (corresponding to the above layer 9). In this way, the dielectric and magnetic losses of the substrate may be varied over much wider ranges than if the additive had been added to the resin. The electrical stray fields radiating from the metallized zones preferably extend in the region of the substrate, particularly if the real part of the dielectric constant is large by comparison with the resin matrix.

A partly metallized sheet-form textile is built up similarly to the particle zone in FIG. 4. A woven fabric of carbon fibers is particularly suitable for this purpose.

A woven fabric or carbon fibers, whether produced on the basis of bitumen, cellulose or polyacrylonitrile filaments, is coated with nickel. Even a minimal metal uptake of the order of 7% of nickel provides for surprisingly high absorption in transmission accompanied by a minimal reflection loss. The nickel-coated carbon fiber fabric showed the following values after application of the nickel:

TABLE 3

| Frequency in GHz | 1-1.5 | 1-2.4 | 7-8 | 11-12 | 35-36 |
|---|---|---|---|---|---|
| Attenuation in dB | 55 | 48(50) | 40(42) | 41(43) | 46(48) |

The values in brackets signify rotation of the test specimen through 90°.

These results are still obtained when the nickel-coated carbon-fiber fabric is subsequently embedded in epoxide resin or polyimide resins. Partial metallization may be obtained, for example, by hydrophobizing or coating (impregnating) with non-wettable substances.

Partly metallized sheet-form textiles, also known as semi-metallized sheet-form textiles, may be obtained by various processes. For example, those regions which are not to be metallized are hydrophobized, i.e. either the fabric is subjected to a waterproofing treatment before activation or alternatively a deactivating treatment is carried out, i.e. the activated zones are treated with chemicals which poison the catalyst, such as dilute chromosulphuric acid for example, so that the zones thus treated can no longer be metallized in the metallizing bath.

However, partial metallization may also be carried out by treating selected regions with the catalyst, for example by brush-coating, dip-coating, spray-coating or impregnating them with the catalyst solution, so that regions are left over which do not contain any catalyst and which therefore do not undergo any reductive metal deposition in the following metal salt bath, i.e. they remain unmetallized.

What is claimed is:

1. A composite material comprising: metallized particles contained in a polymer matrix with additives for increasing at least one of the ohmic, electrical and magnetic losses uniformly present in the polymer or on the particles, wherein the additives includes pigments or conductive carbon black in concentrations of no greater than 10% by weight and wherein the particles are at least partly surrounded by a 0.05 to 20 μm thick, highly conductive metal layer applied by currentless wet-chemical deposition.

2. A composite material as claimed in claim 1, wherein unmetallized regions are present on the particles and wherein the metallized regions are separated by intervals of from 0.01 to 10 μm.

3. A composite material as claimed in claim 1, wherein the layer thickness is from 0.05 to 20 mm.

4. A composite material as claimed in claim 1, wherein the particles are rodlet like.

5. A composite material comprising: metallized particles contained in a polymer matrix with additives for increasing at least one of the ohmic, electrical and magnetic losses uniformly present in the polymer or on the particles, wherein the polymer matrix has a conductivity of from $10^{-2}$ to $10^4$ ohm$^{-1}$ cm$^{-1}$.

6. A composite material comprising: metallized particles contained in a polymer matrix with additives for increasing at least one of the ohmic, electrical and magnetic losses uniformly present in the polymer or on the particles, wherein the additives for increasing the ohmic, dielectric and/or magnetic losses are applied to the particles in a layer having a thickness of from 0.01 to 10 μm.

7. A composite material as claimed in claim 6, wherein the additive layer consists of organic pigments or of a semi-conducting inorganic material and has a conductivity of from $10^0$ to $10^4$ ohm$^{-1}$ cm$^{-1}$.

8. A composite material as claimed in claim 1, wherein the material is overcoated.

9. A shielding material for electromagnetic radiation of no less than 0.05 GHz, comprising the composite material of claim 1.

10. A composite material comprising: metallized particles contained in a polymer matrix with additives for increasing at least one of the ohmic, electrical and magnetic losses uniformly present in the polymer or on the particles, wherein unmetallized regions are present on the particles and wherein the metallized regions are separated by intervals of from 0.01 to 10 μm.

* * * * *

UNITED STATES PATENT AND TRADEMARK OFFICE
CERTIFICATE OF CORRECTION

PATENT NO. : 4,471,015
DATED : September 11, 1984
INVENTOR(S) : Harold Ebneth, et al It is certified that error appears in the above-identified patent and that said Letters Patent is hereby corrected as shown below: On the title page the following should be inserted: --/30/ Foreign Application Priority Data July 1, 1980 /DE/ Fed Rep. of Germany.......30 24 888--.

Col. 1, line 35      Delete "thin" and substitute --thing--

Col. 2, line 54      Before "0.6 µ" insert --a--

Signed and Sealed this

Second Day of April 1985

[SEAL]

Attest:

DONALD J. QUIGG

Attesting Officer      Acting Commissioner of Patents and Trademarks